United States Patent
Hu et al.

(10) Patent No.: US 9,666,476 B2
(45) Date of Patent: *May 30, 2017

(54) DIMENSION-CONTROLLED VIA FORMATION PROCESSING

(71) Applicant: GLOBALFOUNDRIES Inc., Grand Cayman (KY)

(72) Inventors: Xiang Hu, Clifton Park, NY (US); Yuping Ren, Clifton Park, NY (US); Duohui Bei, Clifton Park, NY (US); Sipeng Gu, Clifton Park, NY (US); Huang Liu, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/969,154

(22) Filed: Dec. 15, 2015

(65) Prior Publication Data

US 2016/0099171 A1    Apr. 7, 2016

Related U.S. Application Data

(63) Continuation of application No. 14/315,659, filed on Jun. 26, 2014, now Pat. No. 9,305,832.

(51) Int. Cl.
*H01L 21/768* (2006.01)
*H01L 21/033* (2006.01)
(Continued)

(52) U.S. Cl.
CPC .. *H01L 21/76816* (2013.01); *H01L 21/02063* (2013.01); *H01L 21/0332* (2013.01);
(Continued)

(58) Field of Classification Search
None
See application file for complete search history.

(56) References Cited

U.S. PATENT DOCUMENTS

2005/0153505 A1*  7/2005  Gambino .......... H01L 21/76807
                                                    438/233

OTHER PUBLICATIONS

Hu, Xiang, "Double-Pattern Gate Formation Processing with Critical Dimension Control", U.S. Appl. No. 13/756,689, filed Feb. 1, 2013 (26 pages).

(Continued)

*Primary Examiner* — Jiong-Ping Lu
(74) *Attorney, Agent, or Firm* — Heslin Rothenberg Farley and Mesiti PC; Nicholas Mesiti

(57) ABSTRACT

Methods are provided for dimension-controlled via formation over a circuit structure, including over multiple adjacent conductive structures. The method(s) includes, for instance, providing a patterned multi-layer stack structure above the circuit structure, the stack structure including at least one layer, and a pattern transfer layer above the at least one layer, the pattern transfer layer being patterned with at least one via opening; providing a sidewall spacer layer within the at least one via opening to form at least one dimension-controlled via opening; and etching through the at least one layer of the stack structure using the at least one dimension-controlled via opening to facilitate providing the via(s) over the circuit structure. In one implementation, the stack structure includes a trench-opening within a patterned hard mask layer disposed between a dielectric layer and a planarization layer, and the via(s) is partially self-aligned to the trench.

19 Claims, 7 Drawing Sheets

(51) Int. Cl.
*H01L 23/538* (2006.01)
*H01L 21/311* (2006.01)
*H01L 21/02* (2006.01)
*H01L 21/308* (2006.01)
*H01L 23/522* (2006.01)

(52) U.S. Cl.
CPC ...... *H01L 21/0337* (2013.01); *H01L 21/0338* (2013.01); *H01L 21/3088* (2013.01); *H01L 21/31144* (2013.01); *H01L 21/7681* (2013.01); *H01L 21/76802* (2013.01); *H01L 21/76805* (2013.01); *H01L 21/76807* (2013.01); *H01L 21/76811* (2013.01); *H01L 21/76813* (2013.01); *H01L 21/76831* (2013.01); *H01L 23/5384* (2013.01); *H01L 23/5226* (2013.01); *H01L 2924/0002* (2013.01)

(56) References Cited

OTHER PUBLICATIONS

Choi, Dae Han et al., "Mask Formation Processing", U.S. Appl. No. 13/940,535, filed Jul. 12, 2013 (24 pages).

\* cited by examiner

DIMENSION-CONTROLLED VIA FORMATION PROCESSING

CROSS REFERENCE TO RELATED APPLICATIONS

This application is a continuation application of U.S. patent application Ser. No. 14/315,659, filed Jun. 26, 2014, and entitled "DIMENSION-CONTROLLED VIA FORMATION PROCESSING," now issued as U.S. Pat. No. 9,305,832, the entirety of which is hereby incorporated herein by reference.

FIELD OF THE INVENTION

The present invention relates to circuit structures and to methods of fabricating the same, and more particularly, to dimension-controlled via formation processing, including, for instance, multiple patterning, dimension-controlled via formation processing.

BACKGROUND OF THE INVENTION

Circuit feature fabrication, such as electrical contact feature formation, typically involves the process of transferring a mask pattern to a wafer, with subsequent etching to remove unwanted material, for instance, to facilitate forming the desired circuit feature; such as, to facilitate forming contact vias to conductive structures, either at the active device level, or at a higher-level, back-end-of-line processing stage. This processing is generally referred to as lithography processing. As the size of technology nodes continues to decrease, significant challenges arise due (in part) to issues related to process limitations of traditional lithographic processing techniques, including size issues related to mask patterning for via formation on the wafer.

BRIEF SUMMARY

The shortcomings of the prior art are overcome, and additional advantages are provided, through the provision, in one aspect, of a method which includes, for instance: forming at least one via over a circuit structure, the forming including: providing a patterned multi-layer stack structure above the circuit structure, the patterned multi-layer stack structure including at least one layer, and a pattern transfer layer above the at least one layer, the pattern transfer layer being patterned with at least one via opening therein; providing a sidewall spacer layer within the at least one via opening to form at least one dimension-controlled via opening; and etching through at least the at least one layer of the patterned multi-layer stack structure using the at least one dimension-controlled via opening to provide the at least one via over the circuit structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Also note that reference is made below to the drawings, which are not drawn to scale for ease of understanding, wherein the same reference numbers used throughout different figures designate the same or similar components.

In fabricating integrated circuits (ICs), or semiconductor devices, the density of components continues to increase to achieve greater functionality and reduced manufacturing costs. This increase in component density requires a continued reduction of circuit dimensions and component features, resulting in significant challenges to existing processing techniques, including existing lithographic processing techniques.

One aspect of integrated circuit fabrication typically involves using lithographic processing to facilitate transfer of a mask pattern onto, for instance, a wafer, and thereafter etching the wafer using the transferred pattern to remove unwanted material. Lithographic and etch processes may be repeated as desired to, for instance, facilitate forming circuit features of the integrated circuit. By way of example, the dimension-controlled via formation processing disclosed herein is particularly advantageous in middle-of-line (MOL) or back-end-of-line (BEOL) processing to provide one or more vias (which are alternatively referred to herein as conductive vias) electrically contacting one or more respective conductive structures, such as respective conductive lines of multiple adjacent conductive lines in a BEOL process layer.

Figure 1A:
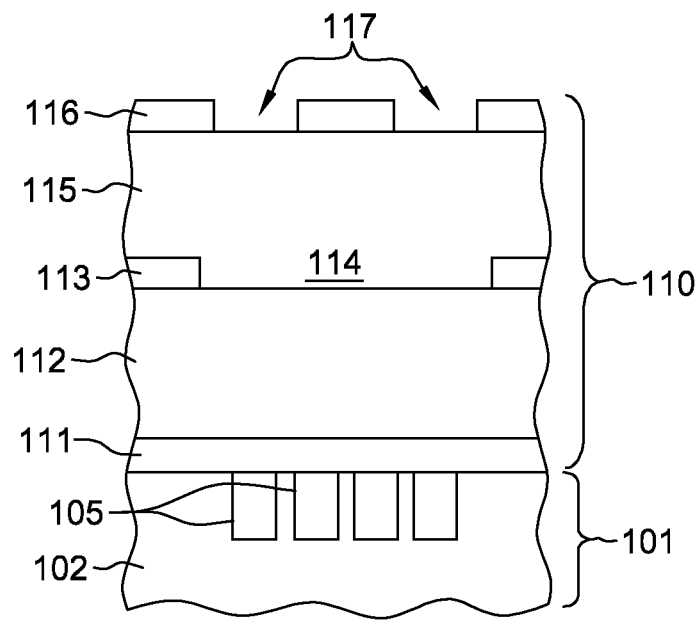
FIG. 1A depicts one embodiment of a multiple-patterned, multi-layer stack structure useful in forming one or more vias over multiple adjacent conductive structures, such as conductive lines, in accordance with one or more aspects of the present invention.
Figure 1B:
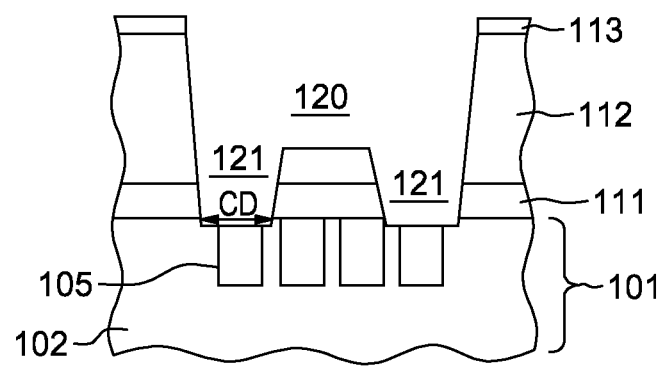
FIG. 1B depicts the structure of FIG. 1A, after etching the multiple-patterned, multi-layer stack structure to facilitate providing, for instance, multiple vias to selected conductive structures of the multiple adjacent conductive structures, along with an interconnecting trench via, and illustrating a potential issue with a critical dimension of the formed vias, in accordance with one or more aspects of the present invention.

By way of example, FIGS. 1A & 1B depict one embodiment of a multi-patterning via formation structure and process for concurrently defining via openings and trench openings during, for instance, back-end-of-line processing.

Referring first to FIG. 1A, an intermediate structure 100 of an integrated circuit or semiconductor device is illustrated, which includes a circuit structure 101, over which a multiple-patterned, multi-layer stack structure 110 is provided. By way of example, circuit structure 101 may include a layer 102 which may comprise or reside upon a wafer being processed. Within layer 102 of circuit structure 101, multiple adjacent conductive structures 105, such as adjacent conductive lines in a back-end-of-line metal layer, have been provided by way of example.

The multiple-patterned, multi-layer stack structure 110 is double-patterned in this example to include multiple via openings 117 aligned at least partially over one or more respective trench openings 114. As illustrated, via openings 117 and trench opening(s) 114 are positioned in one implementation to reside over one or more of the multiple adjacent conductive structures 105 of circuit structure 101. Those skilled in the art will note that the structure and process of FIGS. 1A & 1B are provided by way of example only. For instance, the multiple-patterned, multi-layer stack structure may be configured to implement any desired combination of conductive vias and trench vias to facilitate, for instance, provision of a metal layer in back-end-of-line processing of the circuit structure. In one implementation, the structure may contain a large number of via openings 117 and trench openings 114 in a given metal layer being processed.

In the depicted implementation of the multiple-patterning via formation structure of FIG. 1A, multiple-patterned, multi-layer stack structure 110 includes a protective hard mask 111, such as a layer of nitrogen-doped silicon carbide (N-blok material) or hydrogen-doped silicon carbide (Blok material), and a layer of dielectric material 112 over protective hard mask layer 111. By way of example, dielectric layer 112 may include or be fabricated of, for instance, silicon oxide ($SiO_2$), silicon nitride (SiN or $Si_3N_4$), fluorinated silicate glass (FSG). In another example, dielectric layer 112 may also be a material such as medium-k dielectric material (where k, the dielectric constant value, is in the range of about 3.0 to about 6.0 (note that k=3.9 for $SiO_2$)), a low-k dielectric material (where the dielectric constant value is less than 2.7), or an ultra-low-k dielectric material (the dielectric constant value is less than 2.5). In this embodiment, a patterned hard mask layer 113 resides over dielectric layer 112, having been deposited and lithographically patterned and etched using conventional processing with one or more trench openings 114 aligned (in one embodiment) at least partially over circuit structure 101, for instance, to intersect the multiple adjacent conductive structures 105 thereof. The multiple-patterned, multi-layer stack structure 110 further includes (in this example) a planarization layer 115, such as an organic planarization layer, over which a pattern transfer layer 116 has been provided, and patterned with via openings 117 therein. In one example, organic planarization layer 115 may be any of those conventionally employed during a pattern transfer process and may include an organic polymer, for instance, polyacrylate resin, epoxy resin, phenol resin, polyamide resin, polyimide resin, unsaturated polyester resin, polyphenylenether resin, polyphenylenesulfide resin, or benzocyclobutene (BCB). The via openings 117 may be formed in pattern transfer layer 116 using, for instance, any conventional lithographic patterning and etch process, such as litho-etch-litho-etch processing. The noted layers of structure 100 of FIG. 1A may be formed using a variety of different materials and fabrication techniques, such as chemical-vapor deposition (CVD), atomic layer deposition (ALD), physical vapor deposition (PVD), or plasma-enhanced versions of such processes. Further, the thickness of the depicted layers may vary, depending on the particular application.

In one example, via openings 117 are constrained with a minimum diameter or critical dimension appropriate for the lithographic processing tool employed. For instance, in one example, the critical dimension of via openings 117 in pattern transfer layer 116 may need to be at or larger than 54 nanometers, to ensure appropriate via-chain yield during wafer fabrication processing. As illustrated in FIG. 1B, this can present a critical dimension issue for the via openings, as circuit density continues to increase.

FIG. 1B depicts the structure after multiple-patterning of dielectric layer 112, by etching the structure of FIG. 1A to provide via openings 121 at the bottom of dielectric layer 112, through protective hard mask layer 111, as well as trench opening(s) 120, which comprises (in one example) an elongate trench opening overlying (for instance, transversely) the multiple adjacent conductive structures 105 of circuit structure 101, again by way of example only. Note that in subsequent processing, the via openings and trench openings are filled with a conductive material, such as a metal, in order to provide electrical contact to and interconnect of the selected conductive structures 105 through the resultant electrically-connected conductive vias and conductive trench(es).

As noted, an issue with this process is illustrated in FIG. 1B. As dimensions continue to shrink, reliable limits of lithography processing are being reached. For instance, via openings 117 of FIG. 1A may need to be at or larger than 54 nanometers to accommodate existing lithography tools' ability to ensure high via-chain yield. This means that one or more dimensions of the via opening, when translated to the bottom of the multiple-patterned, multi-layer stack structure 110, may be too great. This is illustrated in FIG. 1B, where the critical dimension (CD) at the bottom of via openings 121 (transverse to, in this example, a length axis of the multiple adjacent conductive structures) may be too large, so that when metalized, a short may arise between adjacent lines. By way of example, in the double-patterned via formation processing of FIGS. 1A & 1B, with a 54 nanometer via opening 117 in pattern transfer layer 116, the bottom critical dimension of via opening 121 in FIG. 1B may be on the order of about 48 nanometers. In one example, the configuration and width of trench opening 114 may be selected to tailor or self-align the via opening 121 dimension into the page of the illustrated depiction, that is, in a direction along the length axis of the multiple adjacent conductive structures 105. Further, in one implementation, it may be desirable to limit the non-self-aligned via critical dimension CD to be smaller than, for instance, 38 nanometers, in order to avoid via-to-contact shorting to an unintended conductive structure 105 of circuit structure 101 as circuit dimensions continue to shrink.

Addressing this issue, disclosed herein is a dimension-controlled via formation processing for use, for instance, with multiple-patterning via formation, such as depicted in FIGS. 1A & 1B. This dimension-controlled via formation processing may be accomplished, in one example, by providing sidewall spacer layers within the via openings of the patterned multi-layer stack structure to enable tuning or adjustment capability to the critical dimension of the via openings 121 over the circuit structure, for instance, to avoid undesirable contact shorts to the underlying conductive structures during multiple-patterning via formation.

As illustrated in FIGS. 2A-2D, the dimension-control via formation processing disclosed herein begins with an intermediate structure 100, such to intermediate structure 100 described above in connection with FIG. 1A. Any number of via openings 117 may be formed in the pattern transfer layer 116 of the multiple-patterned, multi-layer stack structure 110 provided over the wafer.

Figure 2A:
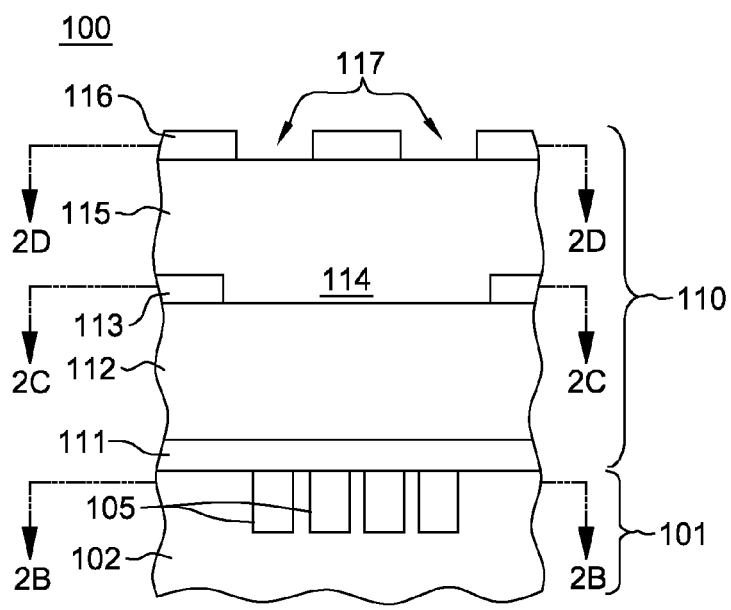
FIG. 2A partially depicts one embodiment of a multiple-patterned, multi-layer stack structure, useful in dimension-controlled via formation processing over a circuit structure, in accordance with one or more aspects of the present invention.
Figure 2B:
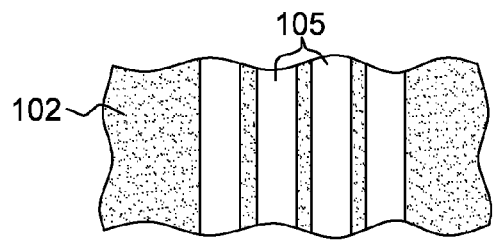
FIG. 2B is a partial cross-sectional plan view of the circuit structure of FIG. 2A, taken along line 2B-2B thereof, in accordance with one or more aspects of the present invention.
Figure 2C:
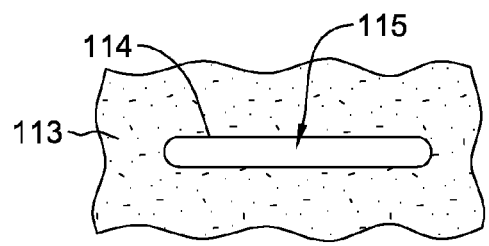
FIG. 2C is a partial cross-sectional plan view of the multiple-patterned, multi-layer stack structure of FIG. 2A, taken along line 2C-2C thereof, in accordance with one or more aspects of the present invention.
Figure 2D:
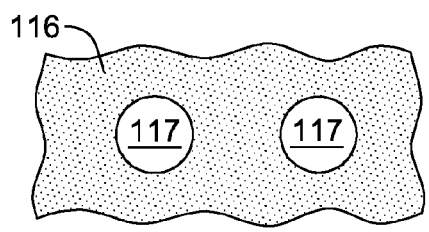
FIG. 2D is a partial cross-sectional plan view of the multiple-patterned, multi-layer stack structure of FIG. 2A, taken along line 2D-2D thereof, in accordance with one or more aspects of the present invention.

In the partial cross-sectional plan view of FIG. 2B, the multiple adjacent conductive structures 105 are illustrated, as one example, to be or include multiple adjacent conductive lines, such as adjacent lines of a back-end-of-line (BEOL) metal layer provided over the wafer. In this case, substrate layer 102 may be an interlayer dielectric material. In FIG. 2C, the patterned hard mask layer 113 is shown to include one or more trench openings 114, within which planarization layer 115 extends in the multiple-patterned, multi-layer stack structure 110 of FIG. 2A. Note that the planarization layer 115 may be fabricated of or include a variety of materials, including, for instance, an organic planarization layer, a spin-on hard mask, etc. Aligned over trench opening 114 are one or more via openings 117, one embodiment of which is depicted in the cross-sectional plan view of FIG. 2D. Note that the two via openings 117 illustrated are provided by way of example only, and that in practice, any number of via openings may be concurrently formed over the wafer, one or more of which may be aligned over respective trench openings, which are to be transferred to at least one layer, such as dielectric layer 112 of the patterned multi-layer stack structure in (for instance) a multiple-patterning via formation process.

Figure 2E:
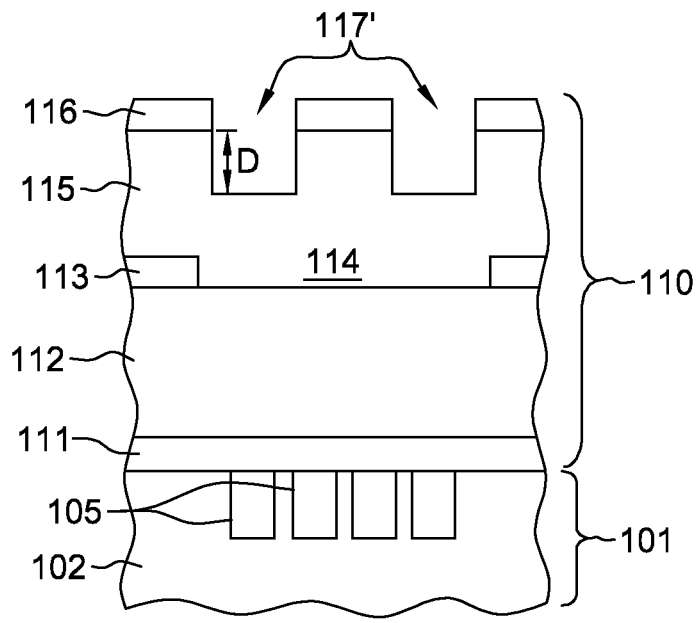
FIG. 2E depicts the structure of FIG. 2A, after partial etching into the planarization layer to a depth D using the pattern transfer layer as a mask to partially extend the via opening(s) into the planarization layer of the multiple-patterned, multi-layer stack structure, in accordance with one or more aspects of the present invention.

In FIG. 2E, the via openings 117' are extended partially into planarization layer 115, for instance, to a depth D. The planarization layer recess depth of the via openings is adjustable, and depends, in one embodiment, on the selectivity of subsequent dielectric etch processing to the critical dimension control layer described below. For instance, the depth D to which the via openings are extended into the planarization layer may be a depth which ensures that the subsequent etching through one or more layers of the patterned multi-layer stack structure will consume the sidewall spacer (described below) to be provided within the via opening(s), while also facilitating a transfer of the below-described dimension-controlled via opening(s) to, for instance, an upper surface of dielectric layer 112 during further, subsequent etching of the planarization layer.

Figure 2F:
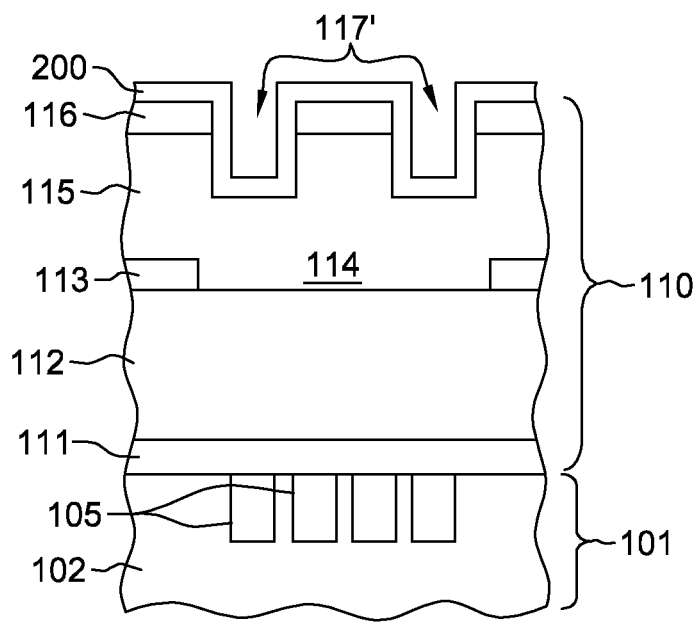
FIG. 2F depicts the structure of FIG. 2E, after providing a conformal dimension-control layer over the multiple-patterned, multi-layer stack structure, including within the via opening(s) therein, in accordance with one or more aspects of the present invention.
Figure 2G:
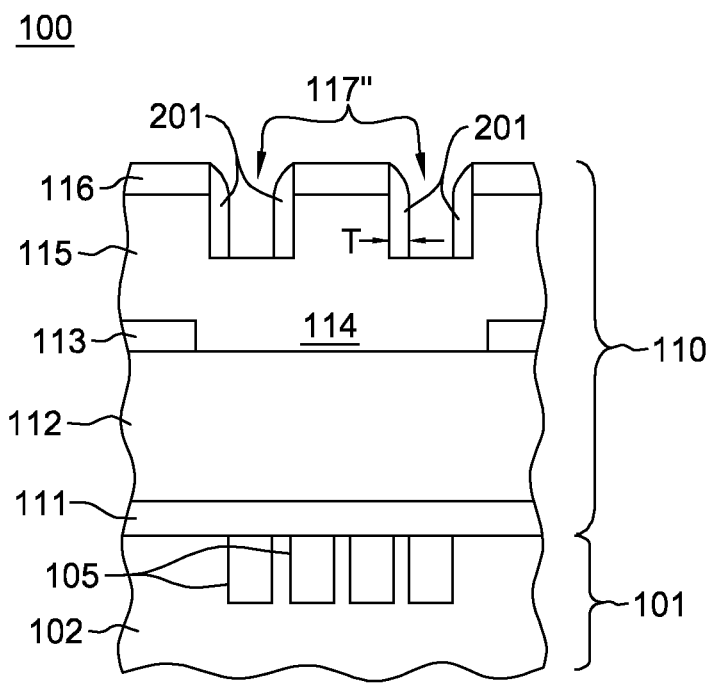
FIG. 2G depicts the structure of FIG. 2F, after anisotropic etching of the conformal dimension-control layer to provide a sidewall spacer layer within the via opening(s), and thereby form dimension-controlled via opening(s), in accordance with one or more aspects of the present invention.

In FIG. 2F, a conformal dimension-control layer 200 is provided over patterned multi-layer stack structure 110, including within the extended via openings 117'. This dimension-control layer, which is provided to a thickness that facilitates the desired critical dimension control of the via opening size to be patterned over the circuit structure 105, may be of a variety of materials, such as materials different from the pattern transfer layer and/or the planarization layer of the patterned multi-layer stack structure. For instance, the conformal dimension-control layer 200 may be a low-temperature, conformal oxide, a nitride, or an amorphous carbon, etc., formed, for instance, via chemical-vapor deposition (CVD), atomic layer deposition (ALD), physical vapor deposition (PVD), or plasma-enhanced versions of such processes.

Figure 2H:
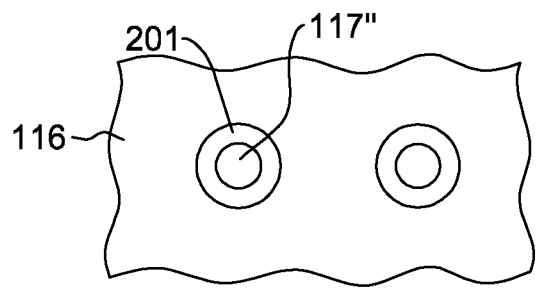
FIG. 2H is a partial top plan view of the multiple-patterned, multi-layer stack structure and circuit structure of FIG. 2G, in accordance with one or more aspects of the present invention.

Conformal dimension-control layer 200 is anisotropically etched, in one embodiment, to provide a sidewall spacer layer 201 on the vertical sidewalls of the via openings to form dimension-controlled via openings 117". A dimension-controlled via opening(s) has, in one embodiment, a reduced diameter, as illustrated in the top plan view of FIG. 2H, in comparison to the original via opening size, with the thickness (T) of the resultant sidewall spacer layer 201 being controlled to provide critical dimension control of the via opening size after the anisotropic etching. As noted, the depth of the dimension-controlled via opening 117", and thus the height of the sidewall spacer layer 201 within the via opening, is selected to ensure that the via pattern transfers to the top dielectric layer 112, which is dependent, in part, on the subsequent etch process employed. In one implementation, too thick a sidewall spacer layer 201 will cause a residual issue in the subsequent etching, while too thin a sidewall spacer layer will be insufficient to transfer the desired critical dimensions successfully to, for instance, dielectric layer 112, or ultimately, to the top of the desired conductive structures 105.

Figure 2I:
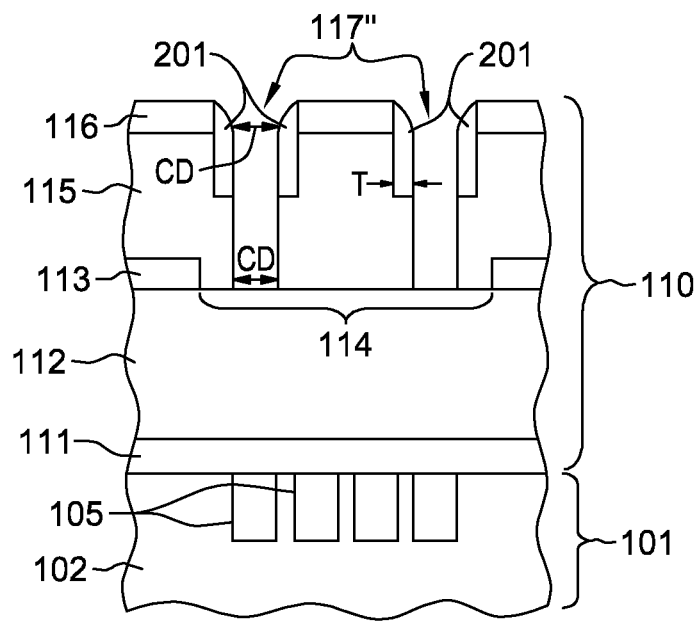
FIG. 2I depicts the structure of FIGS. 2G-2H, after further etching of the planarization layer, using the dimension-controlled via opening(s) to transfer the dimension-controlled via opening(s) to the bottom of the planarization layer, in accordance with one or more aspects of the present invention.
Figure 2J:
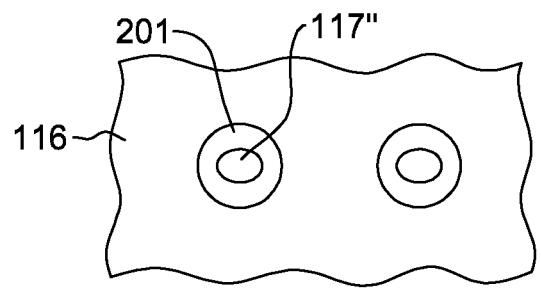
FIG. 2J is a partial top plan view of the structure of FIG. 2I, in accordance with one or more aspects of the present invention.

In FIGS. 2I & 2J, planarization layer 115 has been further etched to transfer the dimension-controlled via opening(s) 117" to the upper surface of dielectric layer 112, including through trench opening 114 in patterned hard mask layer 113. As illustrated in FIG. 2J, this results in a partial self-alignment of the dimension-controlled via opening 117" at the upper surface of dielectric layer 112 to trench opening 114, that is, in one embodiment. The illustrated critical dimension (CD), which may extend along the axis of trench opening 114 is shown in FIG. 2I to be essentially the same critical dimension as defined above by the sidewall spacer layer 201 due, in one embodiment, to a high selectivity to the critical dimension control layer when etching the planarization layer, for instance, using an $O_2$ or $N_2$ etch process.

Figure 2K:
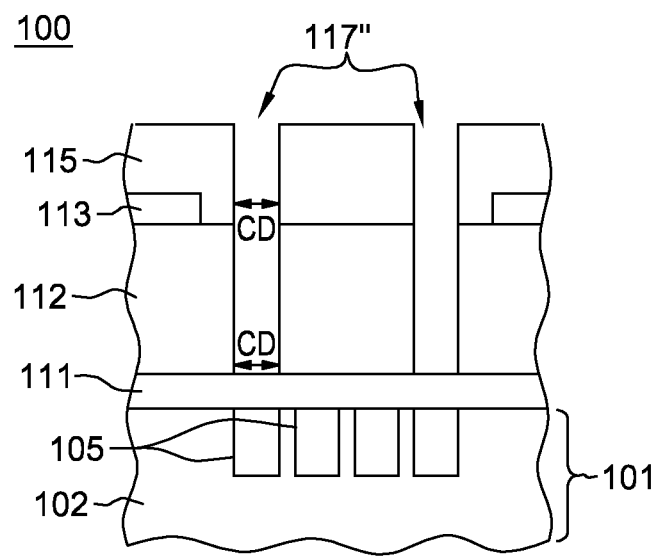
FIG. 2K depicts the structure of FIGS. 2I-2J, after etching of the dielectric layer, using the dimension-controlled via opening(s) to transfer the dimension-controlled via opening(s) to the bottom of the dielectric layer, for instance, to or partially into a protective hard mask layer over the circuit structure, in accordance with one or more aspects of the present invention.

FIG. 2K illustrates the structure of FIGS. 2I & 2J, after etching of the dimension-controlled via openings 117" into dielectric layer 112. As shown, the above-described critical dimension of the dimension-controlled via opening(s) 117" is transferred in this example to the bottom of dielectric layer 112 after the dielectric layer via etch process. In this embodiment, the sidewall spacer layer and a portion of the planarization layer 115 are consumed during the dielectric layer etch, with the depth of the extended via opening into planarization layer 115 described above, and thus, the height of the sidewall spacer layer having being chosen to ensure that the sidewall spacer layer is consumed during this process. By way of example, the dielectric layer 112 may be etched using an reactive ion etching or plasma etching process. In a specific example, reactive ion etching may be performed using fluorine-based chemistry and involve process gases such as tetrafluoromethane ($CF_4$), trifluoromethane ($CHF_3$), difluoromethane ($CH_2F_2$), fluoromethane ($CH_3F$), octafluorocyclobutane ($C_4F_8$), hexafluoro-1,3-butadiene ($C_4F_6$), in the presence of inert gases such as, for example, argon (Ar), helium (He), hydrogen ($H_2$), nitrogen ($N_2$) or oxygen ($O_2$).

Figure 2L:
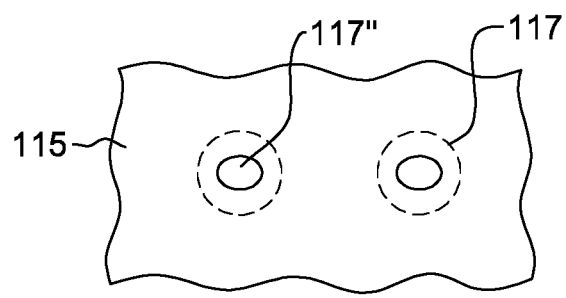
FIG. 2L depicts a top plan view of the structure of FIG. 2K, in accordance with one or more aspects of the present invention.

FIG. 2L is a top plan view of the structure of FIG. 2K, with the initial via openings 117 shown dashed for purposes of comparison with the dimension-controlled via openings 117" at the bottom of dielectric layer 112; that is, at an upper surface of protective hard mask 111 over circuit structure 101.

Figure 2M:
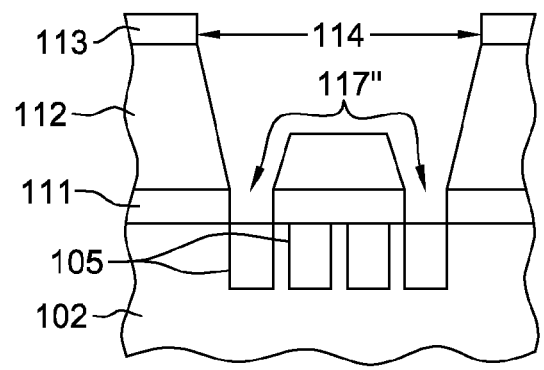
FIG. 2M depicts the structure of FIGS. 2K-2L, after multiple-patterning via opening processing to provide a trench opening and multiple via openings over the circuit structure, wherein the via openings are dimension-controlled, in accordance with one or more aspects of the present invention.

FIG. 2M depicts the structure of FIGS. 2K & 2L, after continued multiple-patterning of dielectric layer 112 to extend trench opening(s) 114 into dielectric layer 112, with the dimension-controlled via openings 117" shown extending through protective hard mask layer 111 to expose the desired, respective conductive structures 105 of the multiple adjacent conductive structures 105. Note that during etch processing of dielectric layer 112, the sidewall spacers are a sacrificial layer to help control the via critical dimension transformation. As shown, the dimension-controlled via openings 117" adjoin trench opening(s) 114 so that when metalized (for instance, using a conventional metallization process), the conductive trench electrically interconnects the conductive vias formed within the dimension-controlled via openings and in contact with the respective selected conductive structures 105.

Figure 2N:
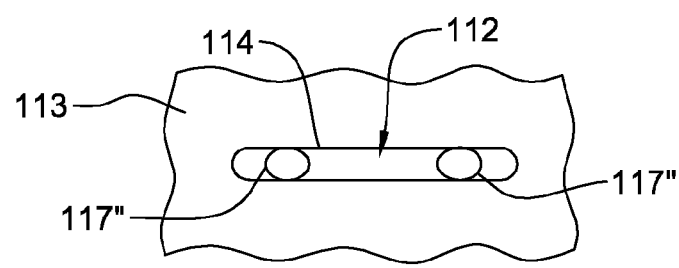
FIG. 2N is a top plan view of the structure of FIG. 2M, in accordance with one or more aspects of the present invention.

FIG. 2N is a partial top plan view of the multiple-patterned structure of FIG. 2M, with the dimension-controlled via openings 117" shown open to one embodiment of trench opening 114.

Figure 3:
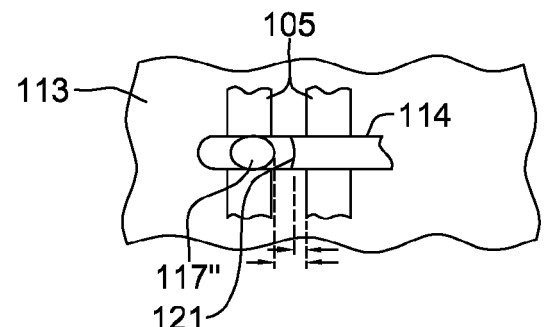
FIG. 3 is a partial schematic depiction of a via opening formed in accordance with the processing of FIGS. 1A & 1B in comparison to one formed with the processing of FIGS. 2A-2N, and illustrating a difference in via size achievable using the multiple-patterning via formation processing of FIGS. 2A-2N, in accordance with one or more aspects of the present invention.

As illustrated in FIG. 3, enhanced via-to-metal margin is achieved using the critical dimension-control processing of FIGS. 2A-2N to controllably reduce the dimension of the dimension-controlled via opening 117" in a direction of the longitudinal axis of the overlying trench opening 114, or transverse to the length axis of the underlying conductive structures 105, in the example presented. Thus, in FIG. 3, the via-to-short margin is shown enlarged with the use of dimension-controlled via openings 117" in comparison to the via openings 121 formed using the multiple-patterning via formation processing of FIGS. 1A & 1B.

Those skilled in the art will note from the above description that provided herein are dimension-controlled via formation processes. Broadly stated, the processes include forming one or more vias over a circuit structure, wherein the forming includes: providing a patterned multi-layer stack structure above the circuit structure, the patterned multi-layer stack structure including at least one layer, and a pattern transfer layer above the at least one layer, the pattern transfer layer being patterned with at least one via opening therein; providing a sidewall spacer layer within the at least one via opening to form at least one dimension-controlled via opening; and etching through the at least one layer of the patterned multi-layer stack structure using the at least one dimension-controlled via opening to facilitate providing the at least one via over the circuit structure.

In one implementation, the method further includes, prior to providing the sidewall spacer, etching partially into the at least one layer using the pattern transfer layer as a mask to extend the at least one via opening into the at least one layer. By way of example, the pattern multi-layer stack structure may include multiple layers above the circuit structure, between the circuit structure and the pattern transfer layer, the at least one layer being at least one layer of the multiple layers, and the multiple layers may include a dielectric layer, and a planarization layer above the dielectric layer. Etching partially into the at least one layer may include etching partially into the planarization layer using the pattern transfer layer as a mask to extend the at least one via opening into the planarization layer.

Providing the sidewall spacer layer may include providing a conformal dimension-control layer over the patterned multi-layer stack structure, including within the at least one via opening extending partially into the planarization layer, and anisotropically etching the conformal dimension-control layer to provide the sidewall spacer layer within the via opening(s) and thereby form the dimension-controlled via opening(s). In one embodiment, the conformal dimension-controlled layer is a different material than the pattern transfer layer or the planarization layer of the stack structure.

Further, etching through the at least one layer of the patterned multi-layer stack structure using the at least one dimension-controlled via opening may consume, at least in part, the planarization layer, including the sidewall spacer layer within the at least one via opening extending into the planarization layer. The etching partially into the at least one layer may be constrained to a depth which ensures that the subsequent etching through the at least one layer of the patterned multi-layer stack structure consumes the sidewall spacer within the at least one via opening.

Further, the etching partially into the at least one layer is performed to a depth which facilitates transfer of the dimension-controlled via opening(s) to an upper surface of the dielectric layer during a subsequent etching of the planarization layer using the dimension-controlled via opening(s). In one embodiment, the sidewall spacer layer is one of an oxide, a nitride, or an amorphous carbon, and the planarization layer is an organic planarization layer, or a spin-on hard mask.

In one implementation, providing the patterned hard mask layer structure further includes providing a patterned hard mask layer between the dielectric layer and the planarization layer, the patterned hard mask layer being patterned with at least one trench opening therein, and the at least one via opening of the pattern transfer layer at least partially overlies the at least one trench opening in the patterned hard mask layer. The circuit structure may include multiple adjacent conductive structure, and the etching through the at least one layer of the patterned multi-layer stack structure using the at least one dimension-controlled via opening may facilitate provision of the at least one via over at least one respective conductive structure of the multiple adjacent conductive structures, and aligned below the at least one trench opening in the patterned hard mask layer. The patterned multi-layer stack structure may further include a protective hard mask layer between the multiple adjacent conductive structures and the dielectric layer, and when forming the at least one via, may include etching through the protective layer to facilitate provision of the at least one via over the at least one respective conductive structure of the multiple adjacent conductive structures.

In one implementation, etching through the at least one layer of the patterned multi-layer stack structure using the at least one dimension-controlled via opening is partially blocked by the patterned hard mask layer in a first direction, limiting width of the at least one dimension-controlled via opening in the first direction at a bottom of the at least one layer, and wherein width of the at least one dimension-controlled via opening in a second direction, transverse to the first direction, may be controlled at the bottom of the at least one layer by the thickness of the provided sidewall spacer layer within the at least one via opening.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    forming at least one via over a circuit structure, the forming comprising:
        providing a patterned multi-layer stack structure above the circuit structure, the patterned multi-layer stack structure comprising at least one layer, and a pattern transfer layer above the at least one layer, the pattern transfer layer being patterned with at least one via opening therein;
        providing a sidewall spacer layer within the at least one via opening to form at least one dimension-controlled via opening; and
        etching through at least the at least one layer of the patterned multi-layer stack structure using the at least one dimension-controlled via opening to facilitate providing the at least one via over the circuit structure; and
    wherein the etching through the at least one layer of the patterned multi-layer stack structure using the at least one dimension-controlled via opening is partially blocked by a patterned hard mask layer in a first direction, limiting width of the at least one dimension-controlled via opening in the first direction at a bottom of the at least one layer, and wherein width of the at least one dimension-controlled via opening in a second direction, transverse to the first direction, is controlled at the bottom of the at least one layer by a thickness of the provided sidewall spacer layer within the at least one via opening.

2. The method of claim 1, further comprising, prior to providing the sidewall spacer, etching partially into the at least one layer using the pattern transfer layer as a mask to extend the at least one via opening into the at least one layer.

3. The method of claim 2, wherein the patterned multi-layer stack structure comprises multiple layers above the circuit structure, between the circuit structure and the pattern transfer layer, the at least one layer being at least one layer of the multiple layers, and the multiple layers comprising a dielectric layer, and a planarization layer above the dielectric layer.

4. The method of claim 3, wherein the etching partially into the at least one layer comprises etching partially into the planarization layer using the pattern transfer layer as a mask to extend the at least one via opening into the planarization layer.

5. The method of claim 4, wherein providing the sidewall spacer layer comprises providing a conformal dimension-control layer over the patterned multi-layer stack structure, including within the at least one via opening extending partially into the planarization layer, and anisotropically etching the conformal dimension-control layer to provide the sidewall spacer layer within the at least one via opening, and thereby form the at least one dimension-controlled via opening.

6. The method of claim 5, wherein the conformal dimension-control layer comprises a different material than the pattern transfer layer or the planarization layer of the patterned multi-layer stack structure.

7. The method of claim 6, wherein etching through the at least one layer of the patterned multi-layer stack structure using the at least one dimension-controlled via opening consumes, at least in part, the planarization layer, including the sidewall spacer layer within the at least one via opening extending into the planarization layer.

8. The method of claim 7, wherein the etching partially into the at least one layer is constrained to a depth which ensures that the subsequent etching through the at least the one layer of the patterned multi-layer stack structure consumes the sidewall spacer within the at least one via opening.

9. The method of claim 7, wherein the etching partially into the at least one layer is performed to a depth which facilitates transfer of the at least one dimension-controlled via opening to an upper surface of the dielectric layer during a subsequent etching of the planarization layer using the at least one dimension-controlled via opening.

10. The method of claim 3, wherein the sidewall spacer layer comprises at least one of an oxide, a nitride, or an amorphorous carbon, and the planarization layer comprises an organic planarization layer.

11. The method of claim 3, wherein the patterned hard mask layer is patterned with at least one trench opening therein, and wherein the at least one via opening of the pattern transfer layer at least partially overlies the at least one trench opening in the patterned hard mask layer.

12. The method of claim 11, wherein the circuit structure comprises multiple adjacent conductive structures, and wherein the etching through the at least the one layer of the patterned multi-layer stack structure using the at least one dimension-controlled via opening facilitates provision of the at least one via over at least one respective conductive structure of the multiple adjacent conductive structures, and aligned below the at least one trench opening in the patterned hard mask layer.

13. The method of claim 12, wherein the patterned multi-layer stack structure further comprises a protective hard mask layer between the multiple adjacent conductive structures and the dielectric layer, and wherein forming the at least one via further comprises etching through the protective hard mask layer to facilitate provision of the at least one via over the at least one respective conductive structure of the multiple adjacent conductive structures.

14. The method of claim 1, wherein the patterned multi-layer stack structure comprises multiple layers above the circuit structure, between the circuit structure and the pattern transfer layer, the at least one layer being at least one layer of the multiple layers, and the multiple layers comprising a patterned hard mask layer, the patterned hard mask layer being patterned with at least one trench opening therein, and wherein the at least one via opening of the pattern transfer layer at least partially overlies the at least one trench opening in the patterned hard mask layer.

15. The method of claim 14, wherein etching through the at least one layer of the patterned multi-layer stack structure using the at least one dimension-controlled via opening is partially blocked by the patterned hard mask layer in a first direction, limiting width of the at least one dimension-controlled via opening in the first direction at a bottom of the at least one layer, and wherein width of the at least one dimension-controlled via opening in a second direction, transverse to the first direction, is controlled at the bottom of the at least one layer by the thickness of the provided sidewall spacer layer within the at least one via opening.

16. The method of claim 15, wherein the circuit structure comprises multiple adjacent conductive structures, and wherein the etching through the at least one layer of the patterned multi-layer stack structure using the at least one dimension-controlled via opening facilitates provision of the at least one via over at least one respective conductive structure of the multiple adjacent conductive structures, and aligned below the at least one trench opening in the patterned hard mask layer.

17. The method of claim 16, wherein the patterned multi-layer stack structure further comprises a protective hard mask layer between the multiple adjacent conductive structures and the at least one layer of the patterned hard mask layer, and wherein forming of the at least one via further comprises etching through the protective hard mask layer to expose the at least one respective conductive structure of the multiple adjacent conductive structures.

18. The method of claim 14, further comprising, prior to providing the sidewall spacer, etching partially into the at least one layer using the pattern transfer layer as a mask to extend the at least one via opening into the at least one layer.

19. The method of claim 18, wherein the etching partially into the at least one layer is constrained to a depth which ensures that the subsequent etching through the at least one layer of the patterned multi-layer stack structure consumes the sidewall spacer within at least one via opening, and facilitates a transfer of the at least one dimension-controlled via opening to a bottom surface of the at least one layer during the etching through the at least one layer of the patterned multi-layer stack structure using the at least one dimension-controlled via opening.

* * * * *